(12) United States Patent
Kreuter

(10) Patent No.: US 10,440,827 B2
(45) Date of Patent: Oct. 8, 2019

(54) PROGRAMMABLE LOGIC CONTROLLER OVERRIDE

(71) Applicant: KMC Controls, Inc., New Paris, IN (US)

(72) Inventor: Paul E. Kreuter, Goshen, IN (US)

(73) Assignee: KMC Controls, Inc., New Paris, IN (US)

( * ) Notice: Subject to any disclaimer, the term of this patent is extended or adjusted under 35 U.S.C. 154(b) by 136 days.

(21) Appl. No.: 15/868,032

(22) Filed: Jan. 11, 2018

(65) Prior Publication Data

US 2018/0199439 A1 Jul. 12, 2018

Related U.S. Application Data

(60) Provisional application No. 62/445,432, filed on Jan. 12, 2017.

(51) Int. Cl.
| | |
|---|---|
| *H05K 1/18* | (2006.01) |
| *H01H 13/14* | (2006.01) |
| *G05B 15/02* | (2006.01) |
| *H05K 1/11* | (2006.01) |
| *G05B 19/05* | (2006.01) |

(52) U.S. Cl.
CPC ............. *H05K 1/181* (2013.01); *G05B 15/02* (2013.01); *G05B 19/058* (2013.01); *H01H 13/14* (2013.01); *H05K 1/11* (2013.01); *H05K 1/18* (2013.01); *G05B 2219/15005* (2013.01); *H05K 2201/10053* (2013.01); *H05K 2201/10159* (2013.01); *H05K 2201/10189* (2013.01)

(58) Field of Classification Search
CPC .. H05K 1/11; H05K 1/18; H05K 2201/10053; H05K 2201/1059; H05K 2201/1089; G05B 15/02; G05B 19/058; G05B 2219/15005; H01H 13/14
See application file for complete search history.

(56) References Cited

U.S. PATENT DOCUMENTS

| | | |
|---|---|---|
| 3,975,622 A | 8/1976 | Horn et al. |
| 4,979,641 A | 12/1990 | Turner |
| 5,056,001 A | 10/1991 | Sexton |
| 5,155,664 A | 10/1992 | Holterman et al. |
| 5,253,140 A | 10/1993 | Inoue et al. |
| 5,253,159 A | 10/1993 | Bilas et al. |
| 5,444,309 A | 8/1995 | Innes et al. |
| 5,651,264 A | 7/1997 | Lo et al. |
| 5,722,887 A | 3/1998 | Wolfson et al. |
| 5,811,939 A | 9/1998 | Herniak |
| 5,830,064 A | 11/1998 | Bradish et al. |
| 5,947,748 A | 9/1999 | Licht et al. |
| 6,392,557 B1 | 5/2002 | Kreuter |

*Primary Examiner* — Robert L Deberadinis
(74) *Attorney, Agent, or Firm* — Shewchuk IP Services, LLC; Jeffrey D. Shewchuk

(57) ABSTRACT

An override board of a programmable logic controller includes a manual switch such as a push button for manual selection between a first "auto" mode where the output is controlled by the programmable logic controller, a second mode where the output is energized, and a third mode where the output is de-energized. The override board can be switched back to the "auto" mode electronically, without physically obtaining access to the controller and without moving the manual switch. The override clear signal is preferably provided on a power connection with the programmable logic controller and to a microprocessor on the override board which controls the output mode.

20 Claims, 4 Drawing Sheets

PROGRAMMABLE LOGIC CONTROLLER OVERRIDE

CROSS-REFERENCE TO RELATED APPLICATION(S)

The present application claims the benefit of U.S. provisional patent application Ser. No. 62/445,432 filed Jan. 12, 2017. The contents of U.S. provisional patent application Ser. No. 62/445,432 are hereby incorporated by reference in entirety.

BACKGROUND OF THE INVENTION

A Programmable Logic Controller ("PLC") is a digitally operated electronic system, designed for use in an industrial environment, which uses a programmable memory for the integral storage of user-oriented instructions for implementing specific functions such as logic, sequencing, timing, counting, and arithmetic to control, through digital or analog inputs and outputs, various types of machines or processes. PLCs have long been used in heating, ventilation and air conditioning ("HVAC") systems with actuators, dampers, valves, sensors, switches and other devices to control the movement and temperature of air, as well as to control other building functions.

In some cases, particularly when working on or troubleshooting the HVAC system, it is desired to allow manual control of one or more of the PLC outputs. U.S. Pat. No. 6,392,557, incorporated by reference, is directed to an override board having a manual auto/on/off switch on an insertable printed circuit board assembly for controlling an individual output of the programmable logic controller.

BRIEF SUMMARY OF THE INVENTION

The present invention is an improvement to PLCs such as disclosed in U.S. Pat. No. 6,392,557. When using the manual auto/on/off switch of U.S. Pat. No. 6,392,557, a problem can arise when an operator or service personnel accidentally leave the switch in either the "on" or "off" position, in that the PLC no longer controls the associated output. To correct the problem requires an additional service call, locating the controller anew (particularly if different personnel respond to the additional service call than originally set the manual switch to the "on" or "off" position), and possibly obtaining access to the ceiling area or other difficult-to-reach location to move the manual switch back to the "auto" position, all of which is costly and time consuming.

The present invention allows switching back to the "auto" mode electronically. An operator can electronically reconfigure the manual auto/on/off switch back to auto control remotely through a user interface without physically obtaining access to the controller. Alternatively, a controller can be programmed to automatically electronically reconfigure the manual auto/on/off switch back to "auto" control by the PLC.

Figure 1:
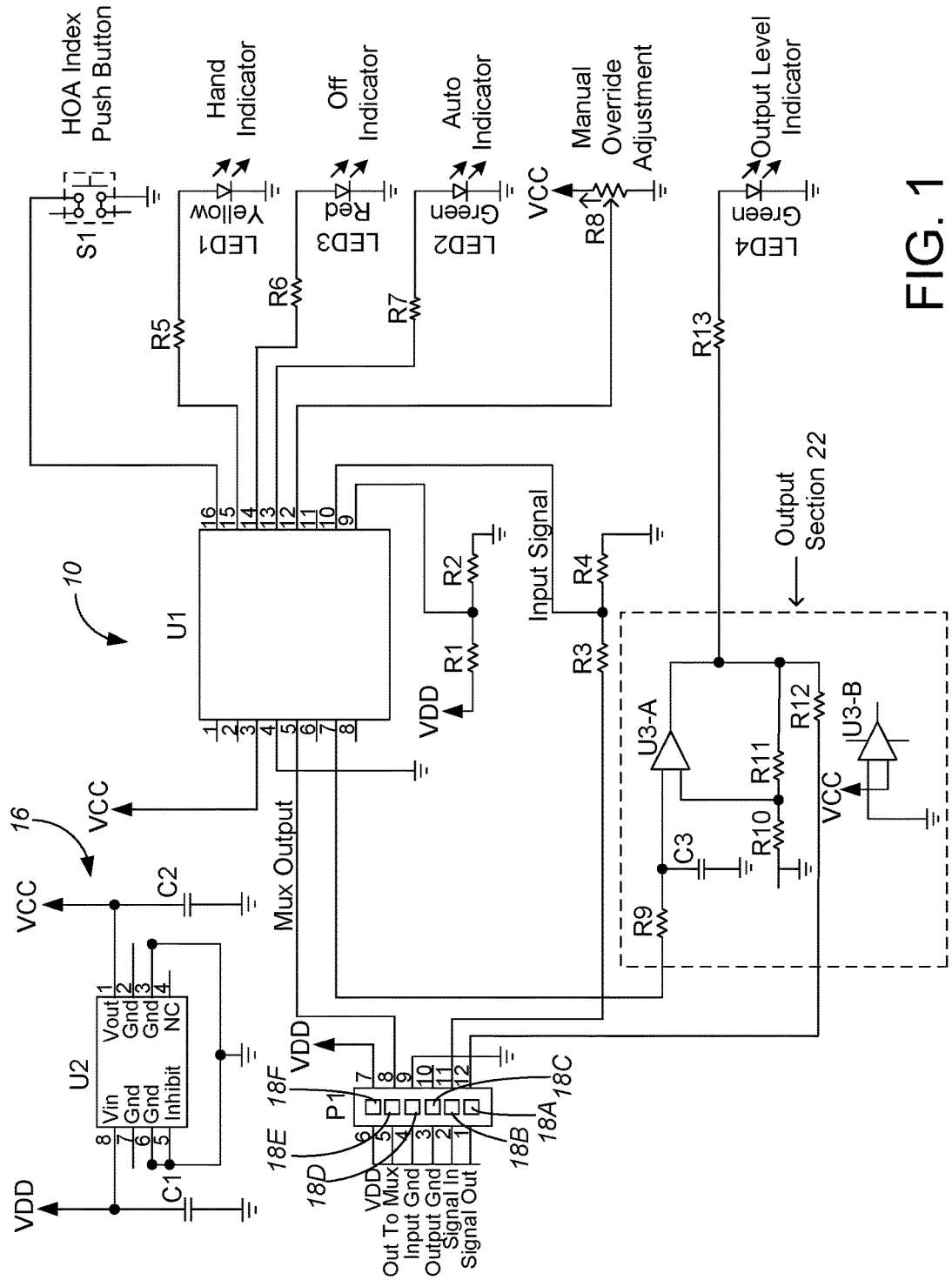
FIG. 1 is an electrical schematic of a preferred embodiment of the present invention, showing one way to implement the output override board with an auto reset function.

While the above-identified drawing figures set forth preferred embodiments, other embodiments of the present invention are also contemplated, some of which are noted in the discussion. In all cases, this disclosure presents the illustrated embodiments of the present invention by way of representation and not limitation. Numerous other minor modifications and embodiments can be devised by those skilled in the art which fall within the scope and spirit of the principles of this invention.

DETAILED DESCRIPTION OF THE PREFERRED EMBODIMENTS

A first preferred embodiment of the present invention involves an electrical circuit board similar to those disclosed in U.S. Pat. No. 6,392,557, with several changes as detailed in the circuit diagram of FIG. 1 and as best shown in the circuit board 10 of FIG. 2. Like the output override boards disclosed in U.S. Pat. No. 6,392,557, the output override board 10 provides an optional manual override feature that can be inserted or removed at the user's discretion for each output of the PLC 12 (shown in FIG. 3) or PLC 14 (shown in FIG. 4). PLC 12 is a prior art controller available as KMD-5801/5802, whereas PLC 14 is a prior art controller available as BAC-A1616BC, both from KMC Controls of New Paris, Ind. The ease at which the boards 10 can be inserted or removed provides a versatile modular system which can be upgraded or altered to handle any change in the process being controlled by the PLC 12, 14. A variety of output override boards 10 may be provided for insertion in the PLC 12, 14 which allows a variety of load types to be controlled. As known in the art, the various electrical components on the board 10 are preferably electrically connected via electrical paths (shown only in FIG. 1) printed onto the board 10.

Like the output override boards disclosed in U.S. Pat. No. 6,392,557, a six pin connector P1 is positioned to plug into the PLC 12, 14 and to provide interface sockets 18A-18F. Each of these interface sockets 18A-18F is preferably in the identical location and with the identical function as in the prior art to mate with the PLC 12, 14, so the preferred embodiment can be used with the same PLCs 12, 14 already installed in the field and in direct substitution of the prior art output boards. Thus, for instance, the preferred embodiment uses a single-row, 6-pin, straight female header strip P1 designed to match 0.1" male headers. This preferred arrangement includes two sockets 18B, 18D corresponding to the signal in and its ground (which ground 18D can also function to ground the entire circuit board 10), and two sockets 18A, 18C corresponding to the signal out and its ground.

Power ($V_{DD}$) is preferably provided on another socket 18F to power the output override board circuit. A power regulator chip U2, and a power circuit 16 including capacitors C1 and C2, is used to condition the incoming power and provide $V_{CC}$ for the board 10. In the preferred embodiment, the power regulator chip U2 is an L4931CD33 very low drop voltage regulator available from ST Microelectronics NV, using a circuit similar to the recommended test circuit with C1 at 0.1 µF and C2 at 2.2 µF. Depending on the application, different types of power regulating circuits can be included, or power regulation can be provided entirely by the PLC 12, 14.

As one important change, the prior art mechanical three-position slide switch is replaced with a push button or some type of solid state switch, referred to as "HOA Index Push Button" S1. The manual switch is preferably mounted on the board 10 so as to be accessible off a side edge 20 of the circuit board when the override board 10 is plugged into the PLC 12, 14. Repeated depression of the new switch S1 allows the user to index or cycle the output board 10 through the different modes (Hand or on, Off, and Auto) until the desired mode is reached and selected. In the Off mode, the signal out on socket 18A is de-energized, essentially connected to ground. In the Hand mode, the signal out on socket 18A is energized. In the Auto mode, the signal out on socket 18A energizes or de-energizes as controlled by the signal in on socket 18B.

The HOA push button S1 could alternatively be some type of solid state switch such as Hall effect. The manual switch S1 could also be a two position switch, where the actual position of the switch is irrelevant but repeated switching (changing of position) causes cycling through the three different HOA modes regardless of the original switch position. As another alternative, the manual switch S1 could also have only two positions, Hand or Off, with the Auto mode only obtainable by the PLC 12, 14. In all these situations, the important consideration is that either the Hand or Off mode can physically selected through the manual switch S1, by a person at the PLC 12, 14 at the time they desire, manually converting away from control of the output by the PLC 12, 14.

Figure 2:
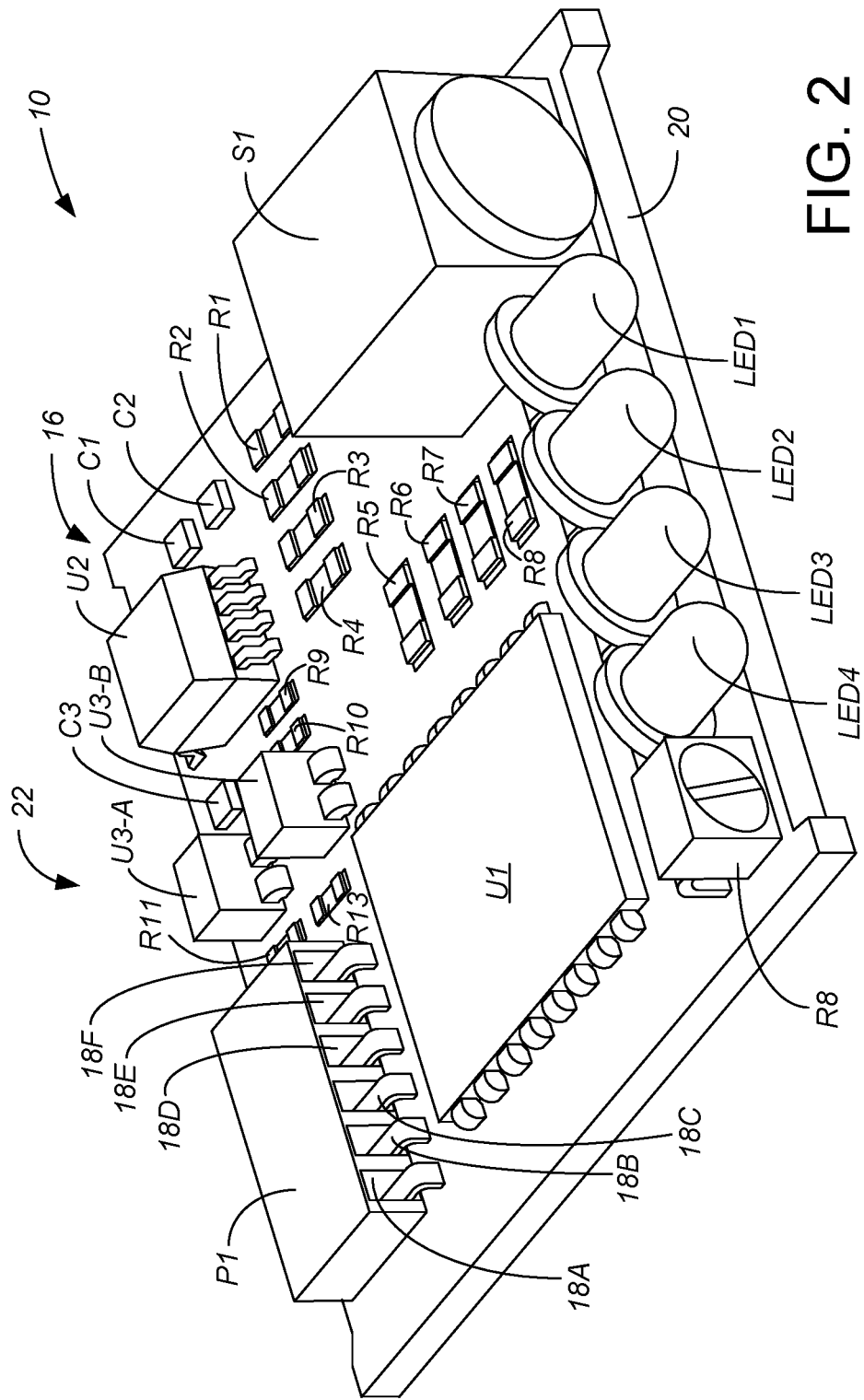
FIG. 2 is a perspective view of an output override board laid out in conformance with the electrical schematic of FIG. 1.

The specific electrical output which is provided on the signal out socket 18A can be selected as desired based on the needs of the system and device being driven by the signal out. In FIGS. 1 and 2, the output section 22 is an analog voltage type. The preferred analog voltage output section 22 includes two low power operational amplifiers U3-A and U3-B, coupled with four resistors R9-R12 and a capacitor C3 as shown in FIGS. 1 and 2. In one preferred embodiment, both operational amplifiers are jointly provided in a single integrated circuit available as LM358 from Texas Instruments. This type of output 22 could alternatively be replaced with a triac output, a relay output, or a current output, as taught in U.S. Pat. No. 6,392,557. The preferred board 10 includes an adjustable potentiometer R8 to control the voltage output, such as within a range of 0-10 VDC. In another preferred embodiment, the output section provides a current output in a 4-20 mA range as selected by the adjustable potentiometer R8, at 10 VDC. Other preferred embodiments have output sections which include a relay (AC or DC) with normally open contacts, a relay (AC or DC) with normally closed contacts, and a triac output w/zero-cross switching. Boards 10 with different outputs can be simultaneously used in different slots 24 of the PLC 12, 14, so the single PLC 12, 14 can drive numerous different types of equipment.

The sixth socket 18E may be used for providing a feedback signal to the PLC 12, 14, referred to as MUX or multiplex signal out. The MUX signal can inform the PLC 12, 14 of the HOA status of the override output board 10. In the preferred embodiment, when the push button S1 has set the output board 10 in an override mode (i.e., either "Off" or "Hand"), the signal from the output board 10 back to the PLC 12, 14, called 'Out to Mux' on FIG. 1, is High. Depending on the configuration of the PLC 12, 14, a signal could then be generated in the PLC 12, 14 which remotely informs an operator of the status of the override board 10. For example, the preferred PLC 12, 14 sends a signal to a remote computer system (not shown) monitoring the PLC 12, 14, so the remote computer display can show the HOA status of the output board 10 whenever desired. For use with other types of PLCs, different interface sockets 18A-18F and/or different interface functions can be used for the connecting sockets 18A-18F, including having a different number of interface sockets at different locations on the board.

An indicator, such as an light emitting diode ("LED") or multiple LEDs 1-4, referred to on FIG. 1 as "HAND INDICATOR", "OFF INDICATOR" and "AUTO INDICATOR", allows the operator to visually know which HOA mode the board 10 is in. The preferred embodiment includes four LEDs 1-4. A green LED4 lights whenever the signal out is energized. A yellow LED1 lights whenever the board 10 is in Hand mode (so, if the yellow LED1 is lit, the green LED4 will also be lit). A red LED3 lights whenever the board 10 is in Off mode (so, if the red LED3 is lit, the green LED4 will be unlit). A green LED2 lights whenever the board 10 is in Auto mode (so, if the green LED2 is lit, whether the green LED4 is lit depends upon the signal in). Each of the four LED indicators 1-4 include a resistor R5-R7 and R13 as part of their circuit. In another preferred embodiment, the four Output, Hand, Off, and Auto LED indicators are combined into one three-color LED indicator, which is unlit whenever the override board is in Auto mode but the signal out is de-energized. When installing such an alternative board into the PLC, the installer can verify that the board is plugged in to the PLC and power is being delivered to the board by cycling through the Hand (LED shows yellow) and Off (LED shows red) modes before again depressing the push button S1 to leave the board in the Auto mode (LED may or may not show green). Other types of visually indicators rather than LEDs can alternatively be used, or, for low cost models, no indicator at all.

As a second important change, the output board 10 uses a microprocessor chip U1 rather than the physical switch to maintain its state. The microprocessor U1 includes a feed from the manual switch S1 which it reads to select between the Hand, Off and Auto modes. Because the microprocessor U1 can read changes in the manual switch S1 (such as any time the push button S1 is momentarily depressed) as well as the actual (open or closed) position of the manual switch S1, the use of the microprocessor chip U1 allows greater flexibility in selecting the specific type of manual switch S1 which can be used. In the preferred embodiment, the microprocessor chip U1 is an 8-bit microcontroller chip MC9S08QG8 available from NXP Semiconductors, with a 20-MHz HCS08 CPU (central processor unit) and 8 Kbytes of FLASH memory and 512 bytes of RAM memory on board. The power regulating circuit 16 is particularly appropriate when the microprocessor chip U1 runs on a different $V_{CC}$ voltage than the voltage $V_{DD}$ provided by the PLC 12, 14. The $V_{DD}$ power input is also provided as an input to the microprocessor U1, tempered between two resistors R1 and R2, particularly beneficial when the override clear signal is provided through $V_{DD}$. Similarly, the signal in is provided as an input to the microprocessor U1, tempered between two resistors R3 and R4. Alternatively, the microprocessor chip U1 could be replaced with discrete logic components.

Figure 3:
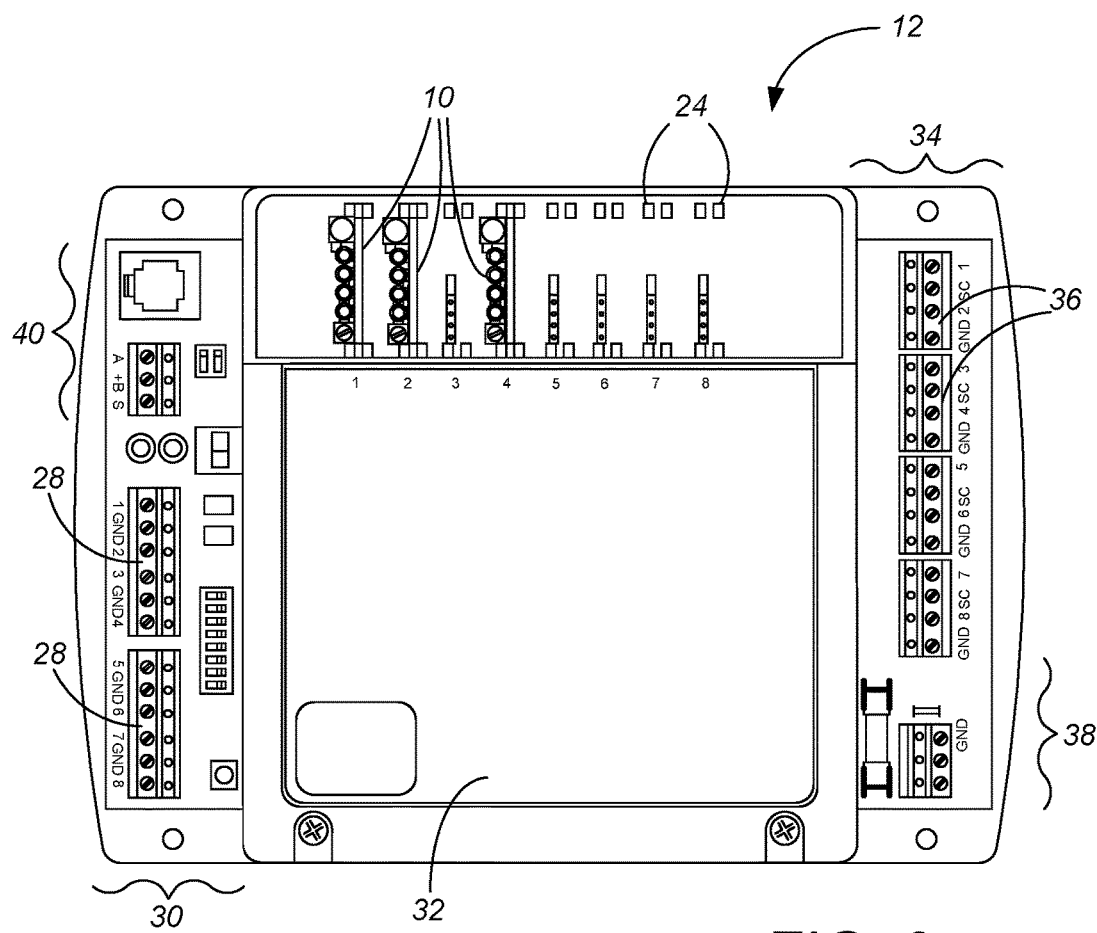
FIG. 3 is a front or top view of a first embodiment of a PLC utilizing three of the output override boards of FIG. 2, shown with the output board cover removed.
Figure 4:
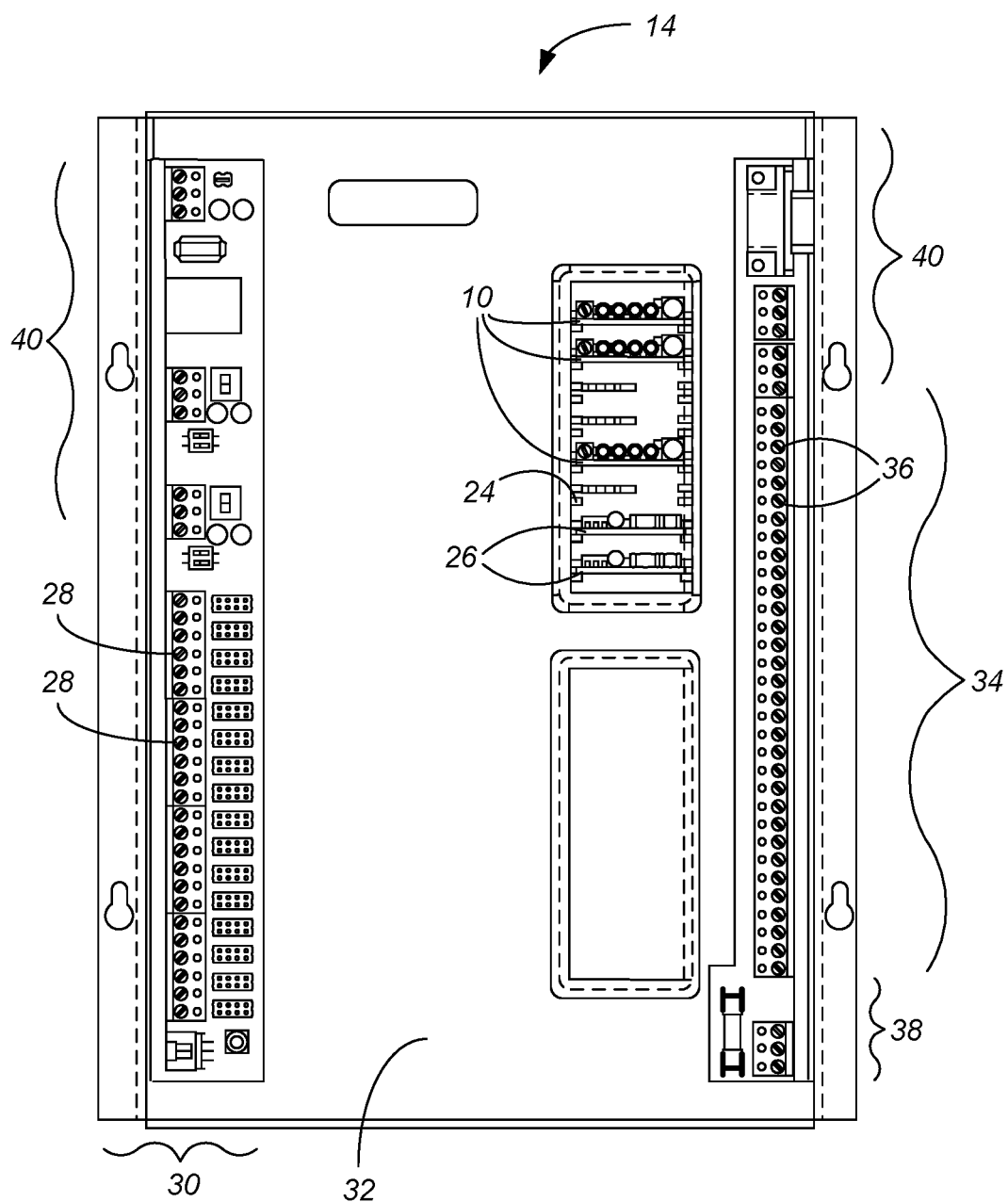
FIG. 4 is a front or top view of a second embodiment of a PLC utilizing three of the output override boards of FIG. 2 while also using two prior art output override boards, shown with the output board cover removed.

The output override board 10 is shown mounted in PLCs 12 (FIG. 3) or 14 (FIG. 4). Each PLC 12, 14 includes input terminals 28 in an input section 30, a logic section 32, an output section 34 with output terminals 36, and a controller power connection portion 38. Other optional features found in typical PLCs may be included as part of the PLC 12, 14 which are not necessary for operation of the inventive output override board 10. For example, the PLC 12, 14 may include network terminals 40 for interfacing the PLC 12, 14 with a computer network or display device (not shown) as well as various pull up resistor dip switches, input fusing, power jumpers and visual indicators. These features are exemplary of some of the features which may or may not be included on the frame of the PLC 12, 14.

The preferred PLCs 12, 14 include a plurality of board tracks or slots 24 disposed so as to allow the output override boards 10 to be connected to the PLC 12, 14. Each set of tracks 24 corresponds to an individual output terminal. FIG. 3 shows three of the preferred output override boards 10, with the other five output board slots 24 unused. FIG. 4 shows three of the preferred output override boards 10, with two outputs using the prior art output boards 26 of U.S. Pat. No. 6,392,557, and three of the outputs board slots 24 being unused.

As another important change, the system has a circuit which can send an electrical signal to the output board 10 causing it to switch back to the "auto" mode. This electrical signal is preferably sent by the PLC 12, 14 but using the output board's power source $V_{DD}$. Alternatively, the controller can send the switch back signal through a separately powered circuit (not shown).

In the preferred embodiment, the "Out To MUX" signal is High whenever the push button S1 has set the output board 10 in an override mode (i.e., either "Off" or "Hand"). The PLC 12, 14 can drive this signal back to Low and that is used to tell the microprocessor U1 on the output board 10 to cancel the Override Mode.

The Override clear signal on the PLC 12, 14 is controlled by a user interface mechanism from external software or control logic site programmed into the PLC 12, 14. The Override clear signal on the PLC 12, 14 can be initiated locally or via remote communication. Whether initiated locally or via remote communication, the preferred user interface software mechanism stores a record of who or what and when the control initiated the override clear signal change.

The automatically-return-to-auto-mode control signal from the PLC 12, 14 to cause the auto reset function could alternatively be placed onto the $V_{DD}$ or Signal In line. The PLC 12, 14 could superimpose a frequency, communication signal, or level shift on either of the $V_{DD}$ or Signal In lines which the output board microprocessor U1 would interpret as an instruction to return the output board 10 to the "Auto" mode.

Another alternative embodiment would simply be based on a timer in the microprocessor chip U1 on the output board 10, so the override output board 10 itself would run a timer and always revert to "Auto" mode at a certain time (say eight hours) after the push-button S1 was last pressed, without any separate control signal from the PLC 12, 14. However, such an alternative would not allow prolonged, desired use of the manual override feature, such as over a period of several days during installation of an HVAC system. Automatically reverting to "Auto" mode after a timer countdown could also energize the output at an inopportune moment when a worker was not expecting the output to change. Accordingly, the preferred embodiment does not allow the output board 10 to revert to "Auto" without a separate and dedicated signal through the PLC 12, 14.

The main advantage of adding the electronic "Auto" reset function to the override output board 10 is to avoid the expense and inconvenience of a service call or needing to physically access a PLC 12, 14 when an output that has been manually overridden and inadvertently left in either the manual "Hand" or on state or the manual "Off" state, and it is desired to return the output board 10 to the "Auto" mode without physical access to the PLC 12, 14 and output board 10.

Although the present invention has been described with reference to preferred embodiments, workers skilled in the art will recognize that changes may be made in form and detail without departing from the spirit and scope of the invention.

The invention claimed is:

1. An override board used to control an output of a programmable logic controller, the override board comprising:
   a circuit board;
   electrical connections mounted to the circuit board and configured so as to allow the override board to be releasably secured from mating electrical connections disposed on the programmable logic controller;
   a manual switch mounted to the circuit board;
   an output device mounted to the circuit board and having an output terminal, wherein the output device is electrically connected to the manual switch, and wherein a first mode setting obtainable with the manual switch transfers control of the output terminal to the programmable logic controller, a second mode setting obtainable with the manual switch energizes the output terminal, and a third mode setting obtainable with the manual switch de-energizes the output terminal; and
   a control circuit on the circuit board, the control circuit being able to receive an override clear signal other than through manipulation of the manual switch and based on the received override clear signal initiate switching of the output device to the first mode setting from at least one of the second mode setting and the third mode setting.

2. The override board of claim 1, wherein the manual switch is a push-button.

3. The override board of claim 1, wherein the manual switch is accessible off a side edge of the circuit board when the override board is plugged into the programmable logic controller.

4. The override board of claim 1, wherein the control circuit comprises a microprocessor chip with on board memory.

5. The override board of claim 4, wherein the control circuit receives the override clear signal from the manual switch, which starts a clocked countdown timer within the microprocessor chip, with the microprocessor chip initiating switching of the output device to the first mode setting at the end of the clocked countdown.

6. The override board of claim 1, wherein the control circuit is able to receive the override clear signal on a power source connection provided to the override board in the electrical connections to the programmable logic controller.

7. The override board of claim 1, wherein the control circuit is able to receive the override clear signal initiated by a software input, and further comprising user interface software which stores a record of by whom or what and when the override clear signal was input.

8. The override board of claim 1, wherein the override clear signal initiates switching of the output device to the first mode setting from either the second mode setting or the third mode setting.

9. The override board of claim 1 and further comprising:
a feedback circuit on the circuit board which provides a feedback signal to the programmable logic controller indicating which of the first, second and third mode settings is active.

10. The override board of claim 9, wherein the control circuit is able to receive the override clear signal on a feedback connection provided by the override board in the electrical connections to the programmable logic controller.

11. The override board of claim 1 and further comprising:
a visual output which provides a visual indication of which of the first, second and third mode settings is active.

12. The override board of claim 1 wherein the output device comprises an operational amplifier used in providing an analog voltage output.

13. The override board of claim 1 wherein the output device comprises a manually adjustable potentiometer allowing control of the voltage or amperage of the output of the programmable logic controller.

14. A method for controlling an output of a programmable logic controller comprising:
releasably inserting an override board into a programmable logic controller such that the override board interfaces with a logic circuit of the programmable logic controller, the override board having an output terminal;
moving a manual switch mounted to the override board, thereby changing the override board from a first mode setting in which energization of the output terminal is controlled by the programmable logic controller to at least one of a second mode setting in which the output terminal is energized and a third mode setting in which the output terminal is de-energized; and
providing an override clear signal to the override board by a mechanism other than movement of the manual switch, the received override clear signal initiating switching of the output terminal to the first mode setting from at least one of the second mode setting and the third mode setting.

15. The method of claim 14, wherein the moving of the manual switch comprises depressing a push-button which is accessible off a side edge of the override board when the override board is plugged into the programmable logic controller.

16. The method of claim 14, wherein the providing an override clear signal comprises starting a clocked countdown timer within a microprocessor chip on the override board, with the microprocessor chip initiating switching of the output device to the first mode setting at the end of the clocked countdown.

17. The method of claim 14, wherein the override clear signal is provided on a power source connection to the override board in electrical connections to the programmable logic controller.

18. The method of claim 14, wherein providing the override clear signal comprises initiating the override clear signal by a software input, and further comprising storing a record of by whom or what and when the override clear signal was input.

19. The method of claim 14, wherein the override board comprises a feedback circuit providing a feedback signal to the programmable logic controller indicating which of the first, second and third mode settings is active, and wherein the override board receives the override clear signal from the programmable logic controller on a feedback connection of the feedback circuit.

20. An apparatus comprising:
a programmable logic controller including at least one output slot; and
an override board releasable secured in the output slot, used to control an output of a programmable logic controller, the override board comprising:
a circuit board powered and controllable from electrical connections disposed on the programmable logic controller;
a manual switch mounted to the circuit board;
an output device mounted to the circuit board and having an output terminal, wherein the output device is electrically connected to the manual switch, and wherein a first mode setting obtainable with the manual switch transfers control of the output terminal to the programmable logic controller, a second mode setting obtainable with the manual switch energizes the output terminal, and a third mode setting obtainable with the manual switch de-energizes the output terminal; and
a control circuit on the circuit board, the control circuit being able to receive an override clear signal other than through the manual switch and based on the received override clear signal initiate switching of the output device to the first mode setting from at least one of the second mode setting and the third mode setting.

* * * * *